(12) United States Patent
Jung et al.

(10) Patent No.: US 8,749,323 B2
(45) Date of Patent: Jun. 10, 2014

(54) BAND STOP FILTER OF COMPOSITE RIGHT/LEFT HANDED STRUCTURE AND THE MANUFACTURING METHOD THEREOF

(75) Inventors: Seung Back Jung, Seoul (KR); Seung In Yang, Seoul (KR)

(73) Assignees: Electronics and Telecommunications Research Institute, Daejeon (KR); Soongsil University Research Consortium Techno-Park, Seoul (KR)

( * ) Notice: Subject to any disclaimer, the term of this patent is extended or adjusted under 35 U.S.C. 154(b) by 394 days.

(21) Appl. No.: 13/117,776

(22) Filed: May 27, 2011

(65) Prior Publication Data

US 2011/0316651 A1 Dec. 29, 2011

(30) Foreign Application Priority Data

Jun. 29, 2010 (KR) .................. 10-2010-0062126

(51) Int. Cl.
*H01P 1/203* (2006.01)
*H03H 7/12* (2006.01)

(52) U.S. Cl.
CPC . *H01P 1/203* (2013.01); *H03H 7/12* (2013.01)
USPC .............................. 333/205; 333/176; 29/846

(58) Field of Classification Search
CPC ................................. H01P 1/203; H03H 7/12
USPC ......... 333/175, 176, 185, 204, 205, 219, 235; 29/846
See application file for complete search history.

(56) References Cited

U.S. PATENT DOCUMENTS

| | | | | |
|---|---|---|---|---|
| 6,996,900 | B2 * | 2/2006 | Hattori | ............................ 29/846 |
| 8,334,734 | B2 * | 12/2012 | Achour | ........................ 333/185 |
| 2006/0152304 | A1 * | 7/2006 | Liang et al. | ................... 333/176 |
| 2010/0207703 | A1 * | 8/2010 | Dupuy et al. | ................. 333/132 |
| 2012/0038437 | A1 * | 2/2012 | Tsuzuki et al. | ............. 333/24 R |

FOREIGN PATENT DOCUMENTS

| KR | 10-0895617 | 4/2009 |
|---|---|---|
| KR | 2009-0126485 A | 12/2009 |
| KR | 2010-0019038 A | 2/2010 |

OTHER PUBLICATIONS

Sungtek Kahng et al., "Miniaturized X-Band Metamaterial Filter for the Ultra-Wide Stopband", vol. 46, No. 12, Dec. 2009, pp. 1163-1168.

"A Design of Compact UWB Bandpass Filter with Wide Stopband at Out-Band and Narrow Stopband at In-Band" by Jung, Seungback, Department of Electronic Engineering Graduate School Soongsil University, Aug. 2009.

"Dual-Band Stop Filter Using Metamaterial TLs" by Oh, Hee-Seok et al., paper of Korean Institute of Electromagnetic Engineering and Science vol. 20 No. 2, Feb. 2009.

* cited by examiner

*Primary Examiner* — Benny Lee
*Assistant Examiner* — Rakesh Patel
(74) *Attorney, Agent, or Firm* — Rabin & Berdo, P.C.

(57) ABSTRACT

Provided are a band stop filter of a CRLH structure and a manufacturing method thereof. A band stop filter of a CRLH structure according to an exemplary embodiment of the present invention includes a microstrip transmission line formed on a substrate; a right handed material (RHM) region including a first stub and a first capacitor connected to the microstrip transmission line in parallel and stopping a signal of a first frequency band passing through the microstrip transmission line; and a left handed material (LHM) region further provided between the first stub and the first capacitor to block a signal of a second frequency band passing through the microstrip transmission line.

18 Claims, 6 Drawing Sheets

US 8,749,323 B2

BAND STOP FILTER OF COMPOSITE RIGHT/LEFT HANDED STRUCTURE AND THE MANUFACTURING METHOD THEREOF

CROSS-REFERENCE TO RELATED APPLICATIONS

This application claims priority under 35 U.S.C. §119 to Korean Patent Application No. 10-2010-0062126, filed on Jun. 29, 2010, in the Korean Intellectual Property Office, the disclosure of which is incorporated herein by reference in its entirety.

TECHNICAL FIELD

The present invention relates to a band stop filter, and more particularly, to a band stop filter of a CRLH structure having band stop characteristics at any frequency and a manufacturing method thereof.

BACKGROUND

Recently, since a wireless communication system uses a plurality of different mixing frequencies, services using adjacent frequencies frequently cause crosstalk.

In order to prevent the crosstalk, when a wireless communication system transmits via one service frequency, it uses a band stop filter stopping other service frequencies to reduce crosstalk between frequencies.

According to the related art, there is a short parallel stub band stop filter formed from microstrip.

However, since the filter has a periodic frequency response characteristic and phase response characteristic, there is a problem of unnecessary resonance at a portion where a phase is shifted by 180°. Further, since the filter uses a stub of a λ/4 length, the size of the stub increases as the resonance frequency gets lower.

For this reason, in order to complement these disadvantages, the filter having various structures has been suggested. In particular, researches on a transmission line having a composite right/left handed (CRLH) structure, in which a left handed material (LHM) and a right handed material (RHM) are mixed are carried on. However, the CRLH structure is limited only to a specific frequency so far.

Further, with the development of portable devices for the wireless communication system, a demand for miniaturization of a device having a band stop filter is increasing, which is hard to achieve by the related art filter.

SUMMARY

An exemplary embodiment of the present invention provides a band stop filter of a CRLH structure including: a microstrip transmission line formed on a substrate; a right handed material (RHM) region including a first stub and a first capacitor connected to the microstrip transmission line in parallel and stopping a signal of a first frequency band passing through the microstrip transmission line; and a left handed material (LHM) region further provided between the first stub and the first capacitor to block a signal of a second frequency band passing through the microstrip transmission line.

Another exemplary embodiment of the present invention provides a method of manufacturing a band stop filter of a CRLH structure including: forming a microstrip transmission line on a substrate; connecting an RHM region including a first stub and a first capacitor and blocking a signal of a first frequency band passing through the microstrip transmission line to the microstrip transmission line in parallel; and adding an LHM region blocking a signal of a second frequency band passing through the transmission line between the first stub and the first capacitor.

Yet another exemplary embodiment of the present invention provides a method for manufacturing a band stop filter of a CRLH structure including: determining first and second frequency bands that are a frequency band to be blocked; designing a first stub, a second stub, a first capacitor, and a second capacitor according to the determination; etching a region other than a microstrip transmission line, the first stub connected to the microstrip transmission line in parallel, and the second stub formed to be spaced by a predetermined interval from the first stub on a substrate; further connecting a first capacitor between a second end of the first stub and a first end of the second stub; connecting the first end of the second stub and a first end of the second capacitor; and connecting a second end of the second stub and a second end of the second capacitor to a ground.

Other features and aspects will be apparent from the following detailed description, the drawings, and the claims.

DETAILED DESCRIPTION OF EMBODIMENTS

Figure 1:
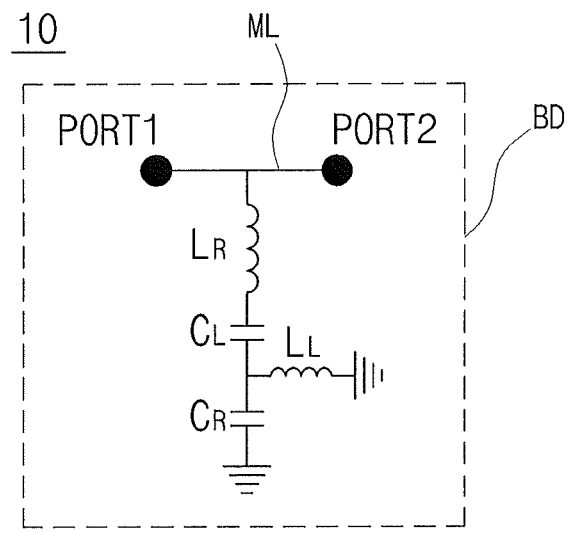
FIG. 1 is a circuit diagram of a band stop filter of a CRLH structure according to an exemplary embodiment of the present invention.

Hereinafter, exemplary embodiments will be described in detail with reference to the accompanying drawings. Throughout the drawings and the detailed description, unless otherwise described, the same drawing reference numerals will be understood to refer to the same elements, features, and structures. The relative size and depiction of these elements may be exaggerated for clarity, illustration, and convenience. The following detailed description is provided to assist the reader in gaining a comprehensive understanding of the methods, apparatuses, and/or systems described herein. Accordingly, various changes, modifications, and equivalents of the methods, apparatuses, and/or systems described herein will be suggested to those of ordinary skill in the art. Also, descriptions of well-known functions and constructions may be omitted for increased clarity and conciseness.

Figure 2:
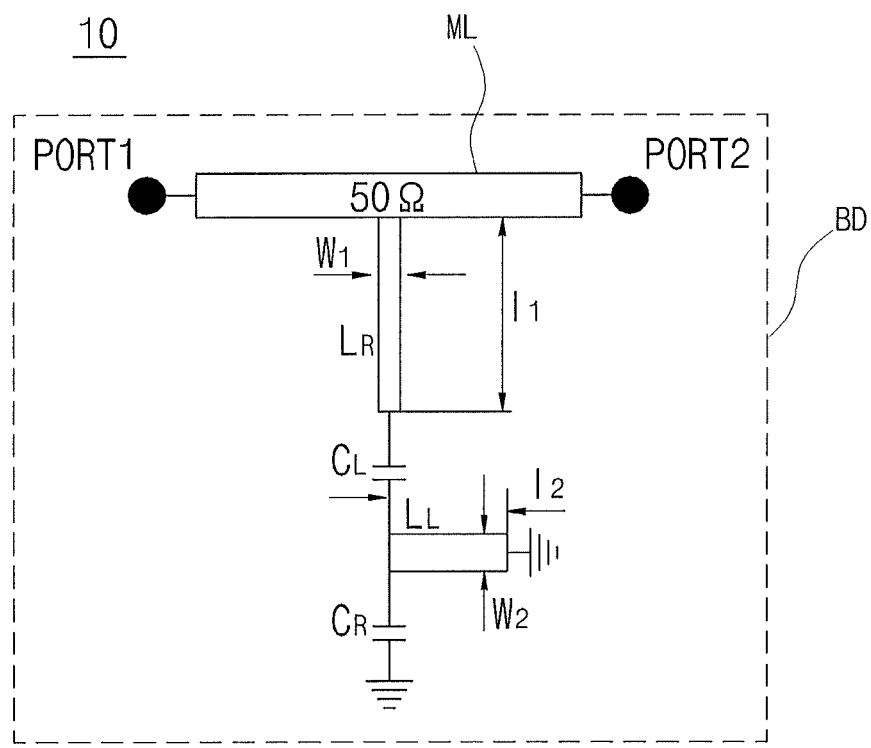
FIG. 2 is a design example of the band stop filter of the CRLH structure according to an exemplary embodiment of the present invention.

FIG. 1 is a circuit diagram of a band stop filter of a CRLH structure according to an exemplary embodiment of the present invention and FIG. 2 is a design example of the band stop filter of the CRLH structure according to an exemplary embodiment of the present invention.

As shown in FIGS. 1 and 2, a band stop filter 10 of a CRLH structure according to an exemplary embodiment of the present invention includes a substrate BD, a microstrip transmission line ML, right handed material region $L_R$ and $C_R$, and left handed material region $L_L$ and $C_L$.

The substrate BD mounts a microstrip transmission line ML, a first stub $L_R$, a second stub $L_L$, a first capacitor $C_R$, a second capacitor $C_L$, a first feed-in terminal PORT1, and a second feed-in terminal PORT2 on one surface. In this case, the remainders other than a microstrip transmission line ML, a first stub $L_R$, and a second stub $L_L$ that is designed as a microstrip is formed on the substrate BD by an etching.

The microstrip transmission ML is formed on one surface of the substrate BD and both ends thereof are connected to the first feed-in terminal PORT1 and the second feed-in terminal PORT2 and connected to RHM region $L_R$ and $C_R$ in parallel. In this case, the microstrip transmission line ML is impedance-matched to 50Ω to reduce the transmission loss.

The RHM region $L_R$ and $C_R$ include the first stub $L_R$ of which the first end is connected to the microstrip transmission line ML in parallel and a first capacitor $C_R$ of which the first end is connected to the LHM region $L_L$ and $C_L$ and blocks a signal of a first frequency band among signals passing through the microstrip transmission line ML.

The LHM region $L_L$ and $C_L$ includes a second capacitor $C_L$ of which the first end is connected to the second end of the first stub $L_R$ and the second end is connected to the first end of the second capacitor $C_L$ and a second stub $L_L$ of which the first end is connected to the second end of the second capacitor $C_L$ and blocks a signal of a second frequency band among signals passing through the microstrip transmission line ML.

In this case, the first capacitor $C_R$ and the second capacitor $C_L$ may be lumped elements and may be a type where capacitance is changed, for example, a varactor diode. In this case, the first and second frequency bands are varied according to capacitance.

The first stub $L_R$ and the second stub $L_L$ is a microstrip line further connected to the microstrip transmission line ML as the purpose for the impedance matching and are configured of inductance L, a width W, and a length l according to the following Equation 1. In the following Equation 1, t is a thickness of a copper plate configuring the first and second stubs $L_R$ and $L_L$ and h is a thickness of dielectric.

$$L(nH) = 2 \times 10^{-4} \left[ ln\left(\frac{l}{W+t}\right) + 1.193 + 0.2235 \frac{W+t}{l} \right] K_g \quad \text{[Equation 1]}$$

$$K_g = 0.67 - 0.146 * ln\frac{W}{h}$$

For example, when the first frequency band and the second frequency band each are a frequency band of a global positioning system (GPS) and a frequency band of an industrial scientific and medical (ISM), the finally designed filter structure is the same as FIG. 2 and W1 according to Equation 1 may be 0.3 mm, may be 3.2 mm, $W_2$ may be 0.5 mm, and $l_2$ may be 2.8 mm.

In addition, the inductance of the first stub $L_R$ and the second stub $L_L$ and the capacitance of the first capacitor $C_R$ and the second capacitor $C_L$ may be calculated by the following Equation 2. Herein, ω1 is 2πf1 (in this case, f1 is a central frequency of a first frequency band), w2 is 2πf2 (in this case, f2 is a central frequency of a second frequency band), Zt is 50Ω as termination impedance, and N is 1 as the number of stubs.

$$L_R \approx \frac{Z\tau[(\omega_1/\omega_2) + 1.76]}{2N\omega_2\left[1 - (\omega_1/\omega_2)^2\right]} \quad \text{[Equation 2]}$$

$$C_R \approx \frac{\pi[(\omega_1/\omega_2) + 1]}{2N\omega_2 Z_\tau\left[1 - (\omega_1/\omega_2)^2\right]}$$

$$L_L \approx \frac{2NZ\tau\left[1 - (\omega_1/\omega_2)^2\right]}{\pi\omega_1\left[1 + (\omega_1/\omega_2)^2\right]}$$

$$C_L \approx \frac{2N\left[0.76 - (\omega_1/\omega_2)^2\right]}{\pi\omega_1 Z_\tau\left[1 + (\omega_1/\omega_2)^2\right]}$$

For example, when the first frequency band is a GPS frequency band and the second frequency band is an ISM frequency band, f1 is 1.575 GHz and f2 is 2.45 GHz, such that $L_R$ is 6.2 nH, $C_R$ is 2.2 pF, $L_L$ is 1.2 nH, and $C_L$ is 2.7 pF, according to the above Equation 2.

Since the band stop filter 10 of the CRLH structure according to the exemplary embodiment has the CRLH characteristics, β calculated by the following Equation 3 is 0 or a negative value.

$$\beta = \beta^{PRH} + \beta^{PLH} = \omega_1\sqrt{L_R C_R} - \frac{1}{\omega_2\sqrt{L_L C_L}} \quad \text{[Equation 3]}$$

Where, ω1 is 2πf1 (in this case, f1 is the central frequency of the first frequency band) and ω2 is 2πf2 (in this case, f2 is the central frequency of the second frequency band).

Meanwhile, the first stub $L_R$ and the second stub $L_L$ may be an open stub or the short stub, but the case where the first stub $L_R$ or the second stub $L_L$ are a short stub will be described herein by way of example.

The first stub $L_R$ and the second stub $L_L$ may be replaced with the inductor having the inductance according to the calculation result of Equation 2.

Hereinafter, the frequency characteristic change of the band stop filter 100 of the CRLH structure according to the exemplary embodiment of the present invention due to the change in values of the RHM region $L_R$ and $C_R$ and the LHM region $L_L$ and $C_L$ will be described with reference to FIGS. 3 and 4.

Figure 3:
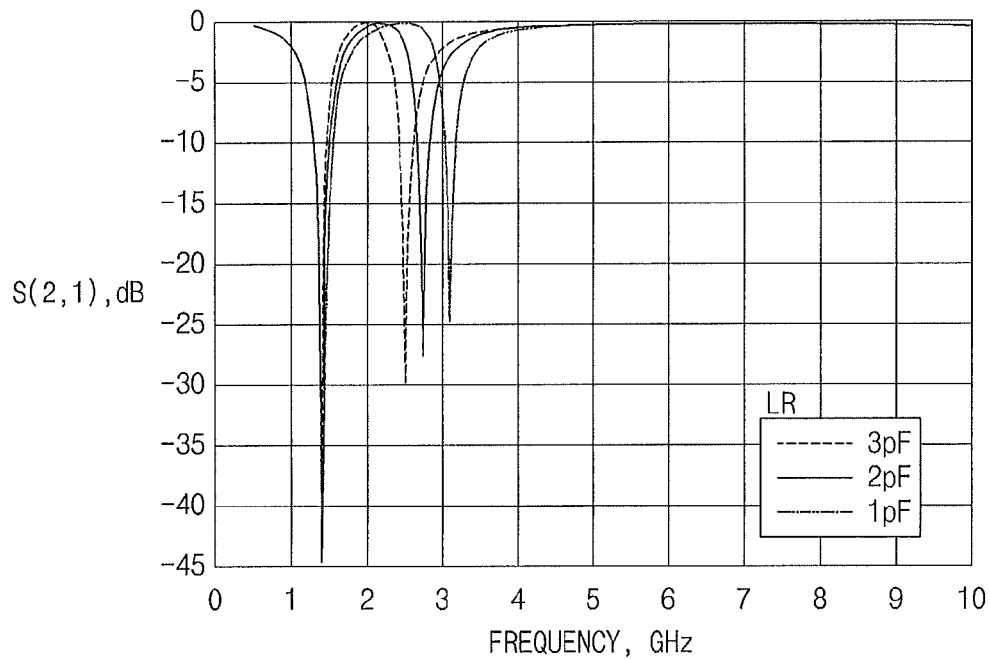
FIG. 3 is a graph showing the change in a frequency response characteristic according to the change in a first capacitor $C_R$ of a band stop filter 10 of the CRLH structure according to an exemplary embodiment of the present invention.
Figure 4:
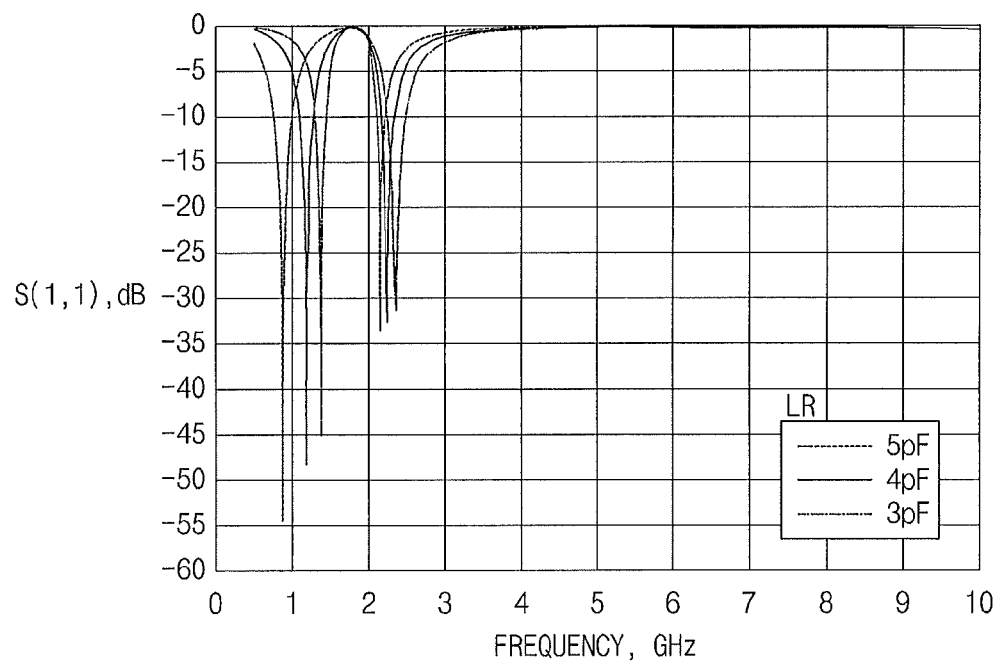
FIG. 4 is a graph showing the change in a frequency response characteristic according to the change in a second capacitor $C_L$ of a band stop filter 10 of the CRLH structure according to an exemplary embodiment of the present invention.

FIG. 3 is a graph showing the change in a frequency response characteristic according to the change in a first capacitor $C_R$ of a band stop filter 10 of the CRLH structure according to the exemplary embodiment of the present invention and FIG. 4 is a graph showing the change in a frequency response characteristic according to the change in a second capacitor $C_L$ of a band stop filter 10 of the CRLH structure according to the exemplary embodiment of the present invention. In FIGS. 3 and 4, a dielectric constant of 3.12, a loss tangent of 0.0018, and a dielectric thickness of 0.767 mm was used.

It can be appreciated from FIG. 3 that when the first capacitor $C_R$ is changed, the change rate of the relatively higher frequency band is larger than that of the lower frequency band, among the first and second frequency bands.

It can be appreciated from FIG. 4 that when the second capacitor $C_L$ is changed, the change rate of the relatively lower frequency band is larger than that of the high frequency band, among the first and second frequency bands.

As such, it can be appreciated from FIGS. 3 and 4 that the exemplary band stop filter 10 of the CRLH structure controls the values of the first and second capacitors $C_R$ and $C_L$ to control each of the first frequency band and the second frequency band, which are to be blocked.

Hereinafter, the characteristics of the band stop filter 10 of the CRLH structure where the first frequency band and the second frequency band each are a GPS band and an ISM band will be described with reference to FIGS. 5 and 6.

Figure 5:
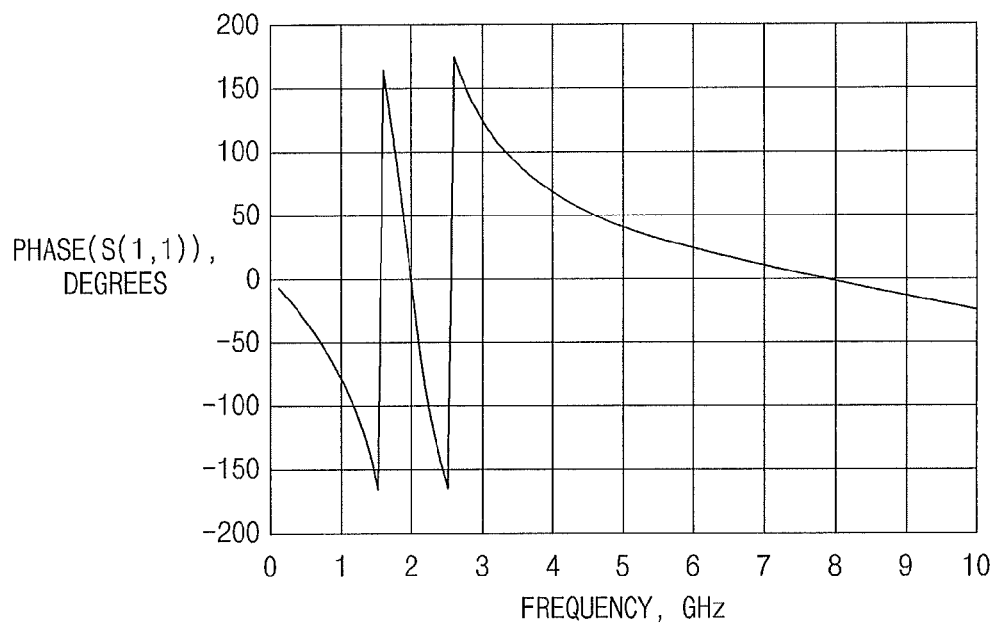
FIG. 5 is a graph showing S (1, 1) phase characteristics for the band stop filter 10 of the CRLH structure where the first frequency band and the second frequency band each are a GPS band and an ISM band.
Figure 6:
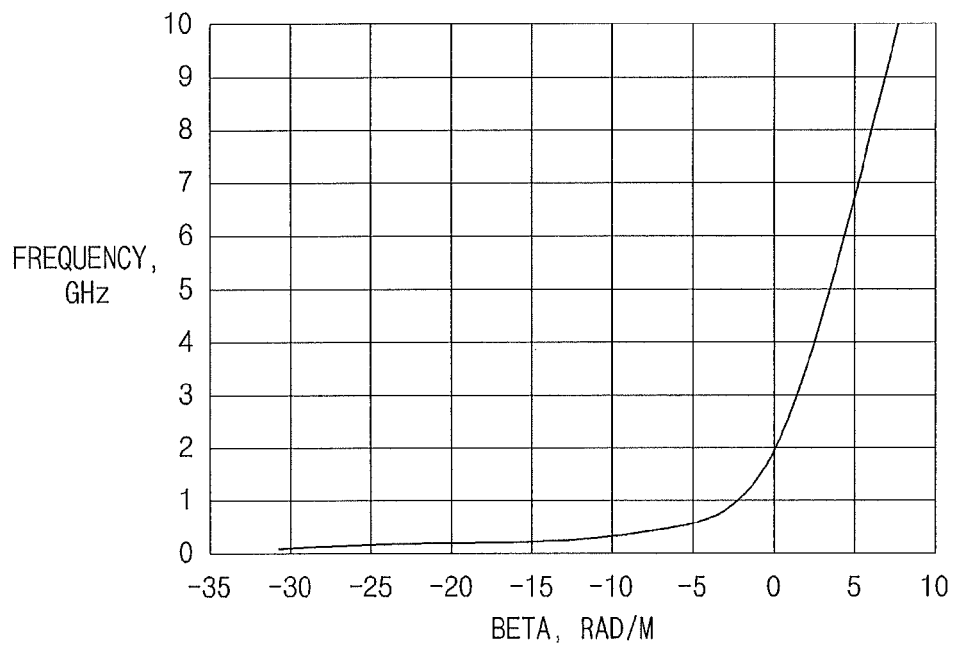
FIG. 6 is a graph showing distributed characteristics for the band stop filter 10 of the CRLH structure where the first frequency band and the second frequency band each are a GPS band and an ISM band.

FIG. 5 is a graph showing S (1, 1) phase characteristics for the band stop filter 10 of the CRLH structure where the first frequency band and the second frequency band each are a GPS band and an ISM band and FIG. 6 is a graph showing distributed characteristics for the band stop filter 10 of the CRLH structure where the first frequency band and the second frequency band each are a GPS band and an ISM band.

In the graph of FIG. 5, it can be appreciated that the band stop filter 10 of the CRLH structure where the first frequency band and the second frequency band each are the GPS band and the ISM band blocks the signals of the GPS band and the ISM band among the signals input to the first feed-in terminal PORT1.

In the graph of FIG. 6, it can be appreciated that the band stop filter 10 of the CRLH structure where the first frequency band and the second frequency band each are the GPS band and the ISM band has left-handed characteristics in which a β value is a negative region.

Figure 7:
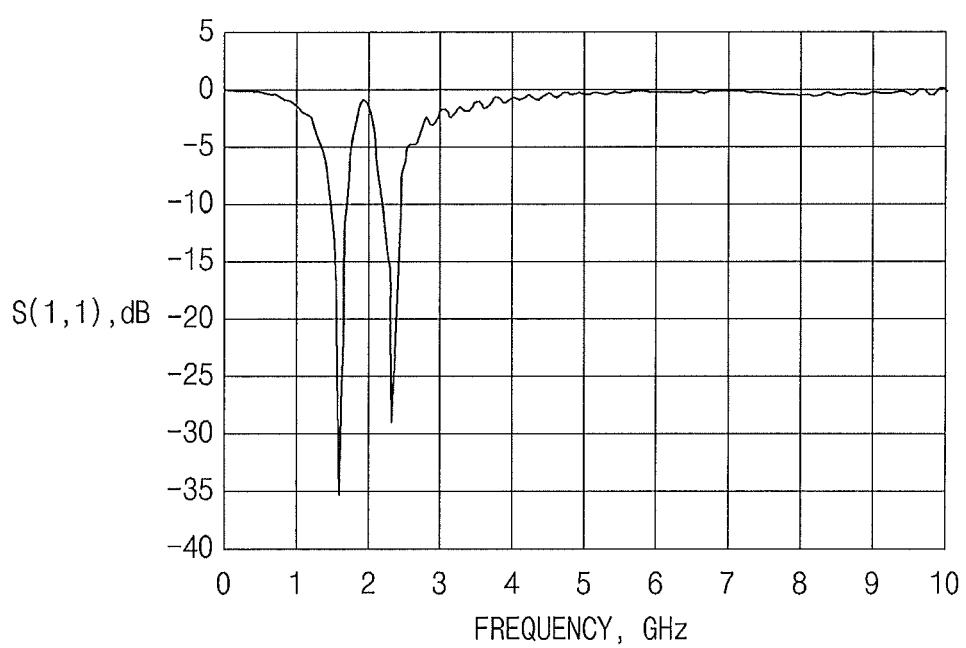
FIG. 7 is a graph showing a frequency response characteristic of the band stop filter 10 of the CRLH structure where the first frequency band and the second frequency band each are the GPS band and the ISM band.

Hereinafter, the frequency response characteristics of the band stop filter 10 of the CRLH structure where the first frequency band and the second frequency band each are a GPS band and an ISM band will be described with reference to FIG. 7). FIG. 7 is a graph showing a frequency response characteristic of the band stop filter 10 of the CRLH structure where the first frequency band and the second frequency band each are the GPS band and the ISM band.

In FIG. 7, it can be appreciated that the band stop filter 10 of the CRLH structure where the first frequency band and the second frequency band each are the GPS band and the ISM band has a band-stop characteristic of approximately −35 dB in the GPS frequency band and has a band-stop characteristic of approximately −29 dB in the ISM frequency band.

Figure 8:
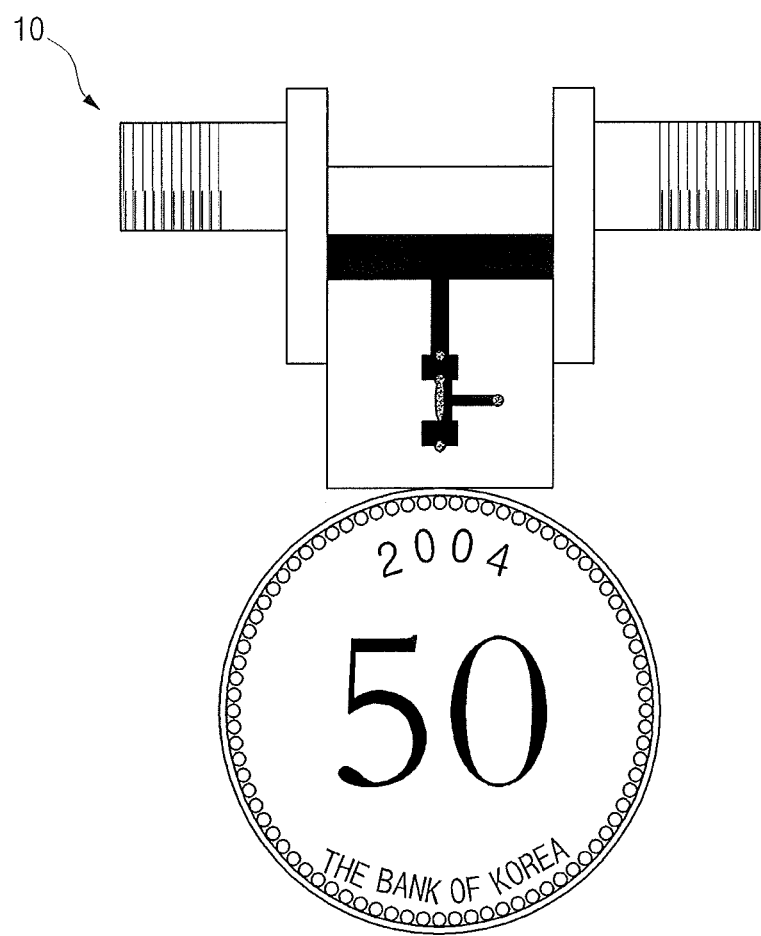
FIG. 8 is a diagram of comparing the band stop filter of the CRLH structure according to an exemplary embodiment of the present invention and a coin.

Hereinafter, the form of the band stop filter 100 of the CRLH structure according to the exemplary embodiment of the present invention will be described with reference to FIG. 8. FIG. 8 is a diagram of comparing the band stop filter of the CRLH structure according to an exemplary embodiment of the present invention and a coin.

In FIG. 8, it can be appreciated that the band stop filter 10 of the CRLH structure according to the exemplary embodiment of the present invention is very small size almost equal to a fifty won coin, which is about 10 mm×15 mm.

When only the microstrip transmission line according to the related art is used, the size of the band stop filter is configured at a size of 47.7 mm ($=\lambda/4$) when intending to band the GPS frequency band and is configured at a size of 31.2 mm ($=\lambda/4$) when intending to the ISM frequency band. Therefore, it can be appreciated that the size surface may be remarkably improved.

As described above, the band stop filter 10 of the CRLH structure is further provided between the feeding line transmitting and receiving the signals to block signals of the first and second frequency bands changeable among the transmitting and receiving signals passing through a feeding line and configured of the microstrip transmission line and the lumped elements, thereby making it possible to implement the miniaturization.

Figure 9:
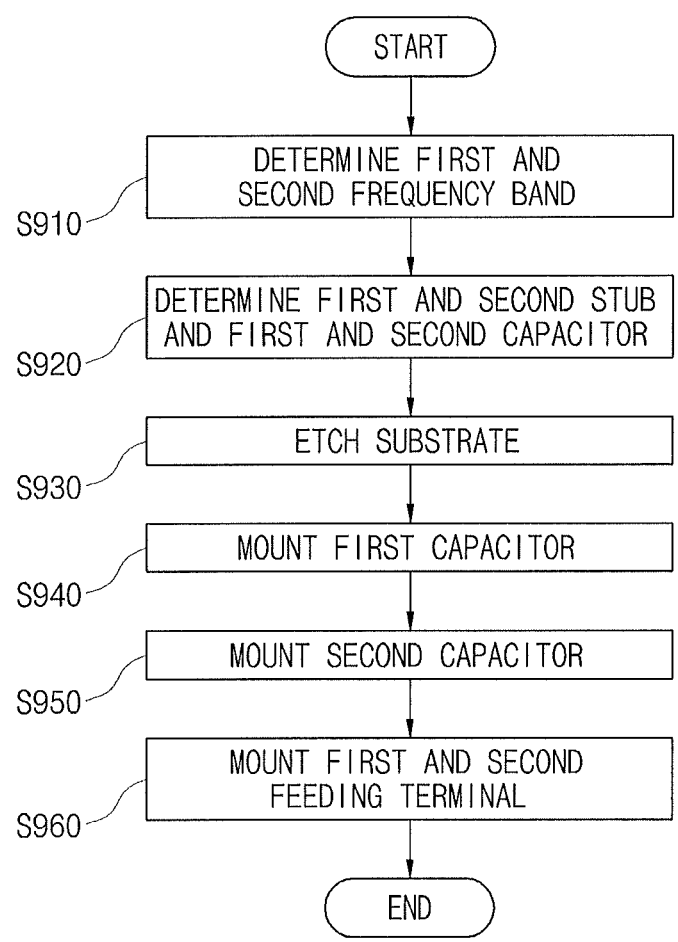
FIG. 9 is a flow chart of the method for manufacturing the band stop filter of the CRLH structure according to an exemplary embodiment of the present invention.

Hereinafter, a method of manufacturing the band stop filter of the CRLH structure according to the exemplary embodiment of the present invention will be described with reference to FIG. 9. FIG. 9 is a flow chart of the method for manufacturing the band stop filter of the CRLH structure according to an exemplary embodiment of the present invention.

Referring to FIG. 9, the first and second frequency bands are determined (S910), such that the width and length of the first stub $L_R$ and the second stub $L_L$ and the capacitance of the first capacitor $C_R$ and the second capacitor $C_L$, etc., are determined (S920).

Thereafter, the remaining regions other than the microstrip transmission line ML, the first stub $L_R$, and the second stub $L_L$ is formed on the substrate BD by an etching (S930).

The first end of the first capacitor $C_R$ is soldered between the second end of the first stub $L_R$ and the first end of the second stub $L_L$ and the second end of the first capacitor $C_R$ is connected to the ground (S940).

In addition, the first end of the first capacitor $C_R$ is mutually connected to the first end of the second capacitor $C_L$ and the second end of the second capacitor $C_L$ is connected to the ground (S950).

Next, the first feed-in terminal PORT1 and the second feed-in terminal PORT2 are each mounted at both ends of the microstrip transmission line ML (S960).

Thereafter, the first feed-in terminal PORT1 and the second feed-in terminal PORT2 is connected with a feeding line in series, thereby making it possible to block the signals of the first and second frequency bands among the signals passing through the microstrip transmission line ML.

Meanwhile, the case where the band stop filter 10 of the CRLH structure according to the exemplary embodiment of the present invention blocks only two frequency bands is described herein by way of example, but the filter (not shown) blocking the third frequency band is further connected to at least one of the microstrip transmission line ML, the first stub $L_R$, the second stub $L_L$, the first capacitor $C_R$, and the second capacitor $C_L$, such that the filter (not shown) can further block the third frequency band passing through the microstrip transmission line ML.

According to the exemplary embodiment of the present invention, it can block the plurality of frequency band by using the filter of a single CRLH structure and has the left handed characteristic and the aperiodic characteristic to have the stop characteristic in the plurality of any frequency band.

Further, according to the exemplary embodiment of the present invention, it can integrate the microstrip transmission line and the lumped elements to significantly improve the size, as compared to the filter configured of only the microstrip.

A number of exemplary embodiments have been described above. Nevertheless, it will be understood that various modifications may be made. For example, suitable results may be achieved if the described techniques are performed in a different order and/or if components in a described system, architecture, device, or circuit are combined in a different manner and/or replaced or supplemented by other components or their equivalents. Accordingly, other implementations are within the scope of the following claims.

What is claimed is:

1. A band stop filter of a composite right/left handed (CRLH) structure, comprising:
    a microstrip transmission line formed on a substrate;
    a right handed material (RHM) region including a first stub and a first capacitor connected to the microstrip transmission line in parallel and stopping a signal of a first frequency band passing through the microstrip transmission line; and
    a left handed material (LHM) region further provided between the first stub and the first capacitor to block a signal of a second frequency band passing through the microstrip transmission line.

2. The band stop filter of claim 1, wherein the LHM region includes a second capacitor and a second stub.

3. The band stop filter of claim 2, wherein a capacitance $C_L$ of the second capacitor and an inductance $L_L$ of the second stub are determined by the following equations:

$$L_L \approx \frac{2NZ_\tau[1-(\omega_1/\omega_2)^2]}{\pi\omega_1[1+(\omega_1/\omega_2)^2]}$$

$$C_L \approx \frac{2N[0.76-(\omega_1/\omega_2)^2]}{\pi\omega_1 Z_\tau[1+(\omega_1/\omega_2)^2]}$$

where $\omega_1$ is $2\pi f1$ (in this case, f1 is a central frequency of the first frequency band), $\omega_2$ is $2\pi f2$ (in this case, f2 is a central frequency of the second frequency band), $Z\tau$ is 50Ω, and N is 1.

4. The band stop filter of claim 2, wherein characteristic values of the first stub and the first capacitor of the RHM region and characteristic values of the second stub and the second capacitor of the LHM region are adjustable, to thereby change the first frequency band and the second frequency band.

5. The band stop filter of claim 1, wherein an inductance $L_R$ of the first stub and a capacitance of $C_R$ of the first capacitor are determined by the following equations:

$$L_R \approx \frac{Z_\tau[(\omega_1/\omega_2)+1.76]}{2N\omega_2[1-(\omega_1/\omega_2)^2]}$$

$$C_R \approx \frac{\pi[(\omega_1/\omega_2)+1]}{2N\omega_2 Z_\tau[1-(\omega_1/\omega_2)^2]}$$

where $\omega_1$ is $2\pi f1$ (in this case, f1 is a central frequency of the first frequency band), $\omega_2$ is $2\pi f2$ (in this case, f2 is a central frequency of the second frequency band), $Z\tau$ is 50Ω, and N is 1.

6. The band stop filter of claim 2, wherein the first stub and the second stub are each configured as a microstrip or an inductor.

7. The band stop filter of claim 1, wherein the band stop filter has a left handed characteristic where a β value of the band stop filter is 0 or a negative number.

8. The band stop filter of claim 1, wherein the band stop filter is formed on one surface of the substrate.

9. The band stop filter of claim 1, wherein each end of the microstrip transmission line is connected in series with a terminal.

10. The band stop filter of claim 2, wherein at least one of the microstrip transmission line, the first stub, the second stub, the first capacitor, and the second capacitor is connected to a filter blocking a third frequency band.

11. A method for manufacturing a band stop filter of a composite right/left handed (CRLH) structure, comprising:
    forming a microstrip transmission line on a substrate;
    connecting in parallel a right handed material (RHM) region including a first stub and a first capacitor to the microstrip transmission line, and blocking a signal of a first frequency band passing through the microstrip transmission line; and
    adding a left handed material (LHM) region blocking a signal of a second frequency band passing through the microstrip transmission line between the first stub and the first capacitor.

12. The method of claim 11, further comprising determining an inductance of the first stub and a capacitance $C_R$ of the first capacitor by the following equations:

$$L_R \approx \frac{Z_\tau[(\omega_1/\omega_2)+1.76]}{2N\omega_2[1-(\omega_1/\omega_2)^2]}$$

$$C_R \approx \frac{\pi[(\omega_1/\omega_2)+1]}{2N\omega_2 Z_\tau[1-(\omega_1/\omega_2)^2]}$$

where $\omega_1$ is $2\pi f1$ (in this case, f1 is a central frequency of the first frequency band), $\omega_2$ is $2\pi f2$ (in this case, f2 is a central frequency of the second frequency band), $Z\tau$ is 50Ω, and N is 1.

13. The method of claim 11, further comprising determining an inductance $L_L$ of a second stub and a capacitance $C_L$ of a second capacitor by the following equations, the LHM region including the second stub and the second capacitor:

$$L_L \approx \frac{2NZ_\tau[1-(\omega_1/\omega_2)^2]}{\pi\omega_1[1+(\omega_1/\omega_2)^2]}$$

$$C_L \approx \frac{2N[0.76-(\omega_1/\omega_2)^2]}{\pi\omega_1 Z_\tau[1+(\omega_1/\omega_2)^2]}$$

where $\omega_1$ is $2\pi f1$ (in this case, f1 is a central frequency of the first frequency band), $\omega_1$ is $2\pi f2$ (in this case, f2 is a central frequency of the second frequency band), $Z_\tau$ is 50Ω, and N is 1.

14. The method of claim 11, further comprising:
    mounting a respective terminal at each end of the microstrip transmission line; and
    connecting a line in series to each of the terminals at each end of the transmission line.

15. The method of claim 13, further comprising confirming whether a β value calculated by the following equation is a negative number:

$$\beta = \beta^{PRH} + \beta^{PLH} = \omega_1\sqrt{L_R C_R} - \frac{1}{\omega_2\sqrt{L_L C_L}}$$

where $L_R$ is an inductance of the first stub and $C_R$ is a capacitance of the first capacitor.

16. The method of claim 15, further comprising if the β value is not a negative number, changing at least one of the capacitance of the first capacitor and the capacitance of the second capacitor.

17. The method of claim 13, further comprising:
changing at least one of characteristic values of the first stub and the first capacitor of the RHM region and characteristic values of the second stub and the second capacitor of the LHM region to thereby change the first frequency band and the second frequency band.

18. A method for manufacturing a band stop filter of a composite right/left handed (CRLH) structure, comprising:
determining first and second frequency bands to be blocked;
designing a first stub, a second stub, a first capacitor, and a second capacitor according to the determination;
forming, on a substrate, a microstrip transmission line, the first stub connected to the microstrip transmission line in parallel, and the second stub formed to be spaced by a predetermined interval from the first stub;
further connecting the first capacitor between a second end of the first stub and a first end of the second stub;
connecting the first end of the second stub to a first end of the second capacitor; and
connecting a second end of the second stub and a second end of the second capacitor to a ground,
wherein an inductance $L_R$ of the first stub, an inductance $L_L$ of the second stub, a capacitance $C_R$ of the first capacitor, and a capacitance $C_L$ of the second capacitor are determined by the following equations:

$$L_R \approx \frac{Z\tau[(\omega_1/\omega_2) + 1.76]}{2N\omega_2[1 - (\omega_1/\omega_2)^2]}$$

$$C_R \approx \frac{\pi[(\omega_1/\omega_2) + 1]}{2N\omega_2 Z_\tau[1 - (\omega_1/\omega_2)^2]}$$

$$L_L \approx \frac{2N Z_\tau[1 - (\omega_1/\omega_2)^2]}{\pi\omega_1[1 + (\omega_1/\omega_2)^2]}$$

$$C_L \approx \frac{2N[0.76 - (\omega_1/\omega_2)^2]}{\pi\omega_1 Z_\tau[1 + (\omega_1/\omega_2)^2]}$$

where $\omega_1$ is $2\pi f1$, f1 being a central frequency of the first frequency band, $\omega_2$ is $2\pi f2$, f2 being a central frequency of the second frequency band, $Z\tau$ is 50Ω, and N is 1.

* * * * *